US009646713B2

(12) United States Patent
Mirabella et al.

(10) Patent No.: US 9,646,713 B2
(45) Date of Patent: May 9, 2017

(54) MEMORY CELL AND CORRESPONDING DEVICE

(71) Applicant: STMicroelectronics S.r.l., Agrate Brianza (IT)

(72) Inventors: Ignazio Bruno Mirabella, Scicli (IT); Salvatore Pappalardo, Catania (IT); Calogero Ribellino, Mascalucia (IT); Alessandro Nicolosi, Dresano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 15/140,023

(22) Filed: Apr. 27, 2016

(65) Prior Publication Data

US 2017/0011808 A1    Jan. 12, 2017

(30) Foreign Application Priority Data

Jul. 10, 2015 (IT) .................. 102015000033005

(51) Int. Cl.
*G11C 17/18* (2006.01)
(52) U.S. Cl.
CPC ................... *G11C 17/18* (2013.01)
(58) Field of Classification Search
CPC ........ G11C 11/406; G11C 7/08; G11C 11/409
See application file for complete search history.

(56) References Cited

U.S. PATENT DOCUMENTS

| 5,265,054 | A | * | 11/1993 | McClure | G11C 29/84 365/189.02 |
| 5,311,070 | A |   | 5/1994 | Dooley | |
| 5,355,340 | A | * | 10/1994 | Coker | G11C 29/846 365/200 |
| 5,392,246 | A | * | 2/1995 | Akiyama | G11C 29/24 365/189.07 |
| 5,544,106 | A | * | 8/1996 | Koike | G11C 29/80 365/200 |
| 5,968,183 | A | * | 10/1999 | Pascucci | G11C 29/808 365/201 |
| 6,421,286 | B1 | * | 7/2002 | Ohtani | G11C 29/44 365/189.07 |
| 7,212,056 | B1 |   | 5/2007 | Belov | |

(Continued)

OTHER PUBLICATIONS

Italian Search Report and Written Opinion for IT 102015000033005 dated Feb. 22, 2016 (7 pages).

*Primary Examiner* — Tuan T Nguyen

(74) *Attorney, Agent, or Firm* — Gardere Wynne Sewell LLP

(57) ABSTRACT

A radiation hardened memory cell includes an odd number of storage elements configured to redundantly store an input data logic signal. The storage elements include output lines for outputting respective logic signals having respective logic values. A logic combination network receives the respective logic signals and is configured to generate an output signal having a same logic value as a majority of the logic signals output from the storage elements. An exclusive logic sum circuit receives the respective logic signals output from the storage elements and is configured to produce a refresh of the logic data signal as stored in the storage elements when one of the logic signals output from the storage elements undergoes a logic value transition due to an error event.

17 Claims, 3 Drawing Sheets

(56) References Cited

U.S. PATENT DOCUMENTS

| | | | |
|---|---|---|---|
| 7,420,859 B2* | 9/2008 | Nautiyal | G11C 29/84 365/200 |
| 8,085,592 B2* | 12/2011 | Yun | G11C 16/10 365/185.09 |
| 8,365,049 B2 | 1/2013 | Pribbernow et al. | |
| 9,009,390 B2* | 4/2015 | Choi | G11C 16/02 365/189.011 |
| 2001/0038304 A1 | 11/2001 | Waldie et al. | |
| 2002/0024869 A1* | 2/2002 | Sakata | G11C 29/785 365/230.01 |
| 2005/0127971 A1 | 6/2005 | Hoff | |
| 2009/0021999 A1* | 1/2009 | Tanimura | G11C 7/222 365/200 |
| 2010/0026338 A1 | 2/2010 | Fulcomer | |
| 2012/0033489 A1* | 2/2012 | Song | G11C 7/12 365/163 |
| 2013/0188426 A1* | 7/2013 | Park | G11C 16/10 365/185.22 |
| 2015/0332755 A1* | 11/2015 | Singh | G11C 5/06 365/72 |

* cited by examiner

MEMORY CELL AND CORRESPONDING DEVICE

PRIORITY CLAIM

This application claims priority from Italian Application for Patent No. 102015000033005 filed Jul. 10, 2015, the disclosure of which is incorporated by reference.

TECHNICAL FIELD

The description relates to memory cells. One or more embodiments may relate to radiation hardened memory cells.

BACKGROUND

In certain environments, such as for example space environments, memory cells may be exposed to the radiation impact of heavy ions, which may lead to a so-called Single Event Effect or SEE.

Such events may adversely affect operation of memory cells that store logical data for a long period, since phenomena such as SEE may lead to such data being modified.

There is a need in the art to counter such effects.

SUMMARY

One or more embodiments may be applied in memory cells adapted to receive information from upstream circuits. A One Time Programmable Read Only Memory—OTP ROM, digital counters, shift registers, analog-to-digital converters are exemplary of such circuits.

One or more embodiments may offer one or more of the following advantages: very low "zero current" absorption, possibility of dispensing with additional architectures such as a refresh oscillators, avoidance of noise possibly added by refresh oscillators, and smaller silicon area involved.

In an embodiment, a memory cell includes: a plurality of storage elements for redundantly storing an input data logic signal, said plurality of storage elements having output lines for outputting a respective plurality of logic signals having respective logic values, a logic combination network sensitive to said respective logic values of said logic signals on said output lines, said logic combination network configured to generate an output signal of the cell having the same logic value as a majority of said logic signals on said output lines, and an exclusive logic sum circuit sensitive to said respective logic values of said logic signals on said output lines, said exclusive logic sum circuit configured to produce a refresh of said data logic signal as stored in said plurality of storage elements, said exclusive logic sum circuit activated when one of said logic signals on said output lines undergoes a logic value transition.

In an embodiment, said memory cell is part of an electronic device. In an embodiment, a memory cell comprises: a plurality of storage elements for redundantly storing an input data logic signal, said plurality of storage elements having output lines for outputting a respective plurality of logic signals having respective logic values, and a sensing circuit monitoring the plurality of logic signals to detect a single event transient (SET) error and in response thereto cause a refresh of said data logic signal as stored in said plurality of storage elements.

BRIEF DESCRIPTION OF THE DRAWINGS

One or more embodiments will now be described, by way of example only, with reference to the annexed drawings, in which.

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the scope of protection or the scope of the embodiments.

Figure 1:
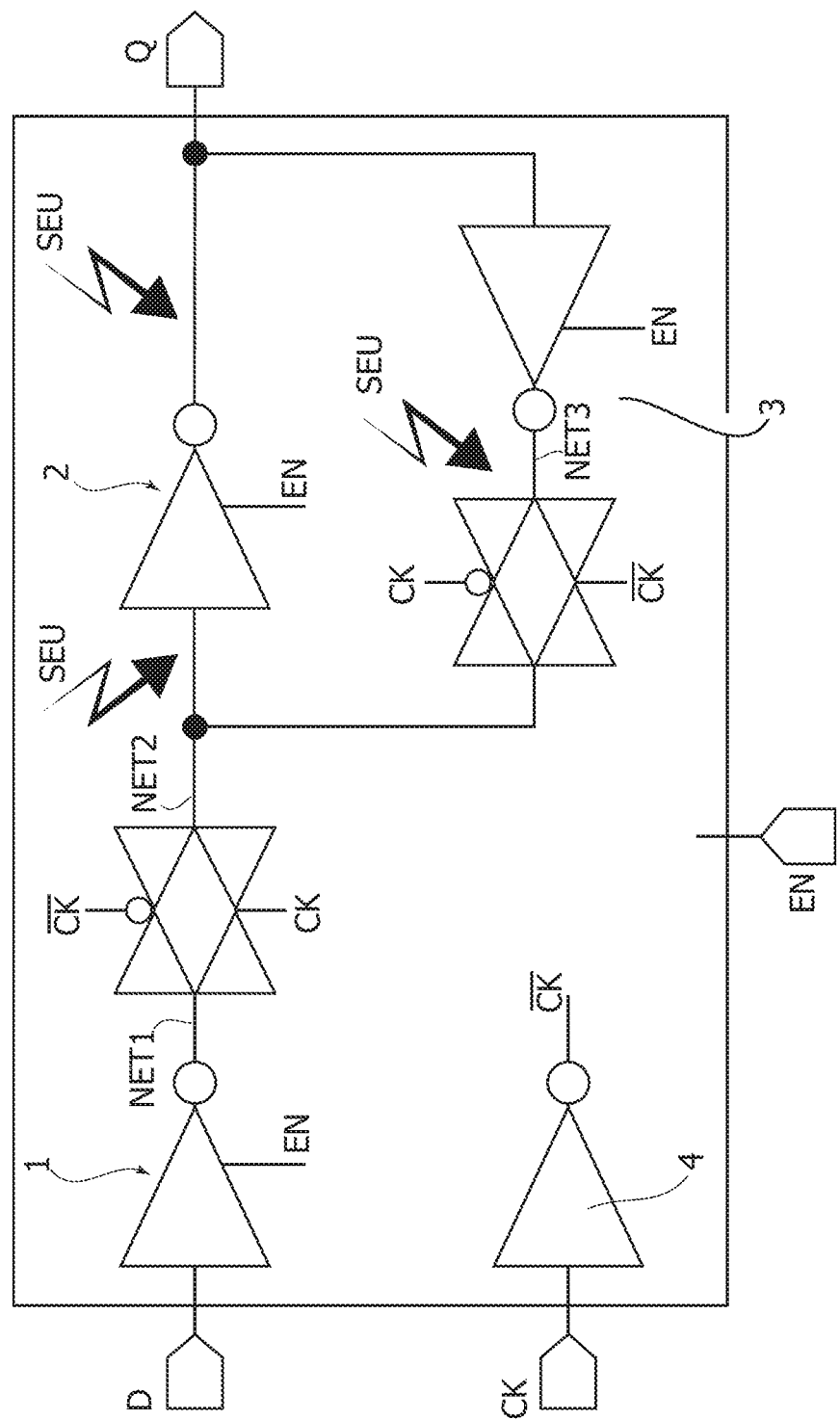
FIG. 1 is a block diagram exemplary of a memory cell layout.

The block diagram of FIG. 1 is exemplary of a possible layout of a memory cell (for example flip-flop based) for electronic data with a data input D, a cell enable input EN and a clock input CK. Such an arrangement may be operable for writing data therein and making those data available as an output Q.

The deliberately simplified representation of FIG. 1 is generally exemplary of such an arrangement including:
   an input stage 1 which receives input data D,
   an output stage 2 which receives data from the input stage 1 to make them available as an output data Q, and
   a further stage 3 configured to feed the output signal Q back to the input of the output stage 2.

Operation of the stages 1, 2, and 3 (here simply represented as logical inverters) is enabled by the enable signal EN and clocked by the clock signal CK and its logical complement (CK(bar)) CK as generated by a further inverter stage 4.

The general layout and principle of operation of the arrangement of FIG. 1 is well known in the art which makes it unnecessary to provide a more detailed description herein.

Briefly, when an arrangement as represented in FIG. 1 receives a clock signal of for example "high" logical level, the data D is stored to be made available as output Q. If the clock signal CK is set to a "low" logic level, whatever the input data D, the output Q maintains its value (that is information) at the state previously stored. Consequently, a change of the value of data may be admitted only on the front edge of a high logic level of the clock signal CK.

In certain environments, such as space environments, memory cells as schematically represented in FIG. 1 may be exposed to the impact of heavy ions (for example a Single Event Effect or SEE) that may alter the information stored in the memory cell. This may possibly lead to a loss of information which in turn may cause incorrect operation of the memory cell and the devices in which such a memory cell is included, for example with circuitry being enabled and/or disabled inappropriately.

The arrows in FIG. 1 are representative of various locations that may be affected by a SEE, such as for example a Single Event Up Set or SEU.

For instance, a SEU may have an energy sufficient to induce a current in a PN junction and, if hitting for example the output of the stage 2 (for example a bistable latch), the logic state stored at the output Q may be changed (from 1 to 0 or from 0 to 1). Other circuit locations exposed to a SEU may include for example the input NET2 to the stage 2 or the output NET3 of the latch in the stage 3.

A solution to palliate the related negative events may involve resorting to redundancy, by storing identically the data in an (for example odd) plurality of latches (such as for example three latches) and then select the correct information as the information "voted" by the majority of the values latched.

Also, an event such as for example a Single Event Transient or SET can alter the logical state in the input stage 1 (for example a D flip-flop) so that incorrect information can be stored in a memory cell at the occurrence of a clock pulse.

A possibility for palliating such a drawback may involve filtering the input data D for example via a resistive-capacitive (RC) network with a time constant larger than the expected duration of the obnoxious external event.

If occurring "upstream" of a clock signal, such an event may give rise to a glitch.

Again, a possibility of palliating such a drawback may lie in (low-pass for example RC) filtering the clock signal pulse by slowing it down appropriately for application to plural latches again to perform "voting" at the end of the data output.

If a SET occurs "upstream" of an enable signal EN, this may again give rise to a glitch with a momentary shutdown of the cell. Again, the possibility exist of (low-pass for example RC) filtering adequately the enable pulse.

In cases where a memory cell as exemplified in FIG. 1 is used to store data over a long time, even when resorting to a redundant structure, for example to plural latches, different latches may be adversely affected by subsequent SEU events, so that false information may be eventually produced by the voting cell, due to the majority being possibly "reversed" since plural latches have been modified.

Continuous refresh of data may be resorted to in order to tackle these situations. Such a solution may result in an undesirable addition of architectural components to the system for example a low-frequency oscillator to generate a periodic clock pulse. This may increase power consumption and silicon area occupation; noise at the frequency of the refresh signal may also be generated which may adversely affect the surrounding components.

Documents such as U.S. Pat. Nos. 7,212,056, 8,365,049 or 5,311,070 are exemplary of solutions proposed to counter such events.

Figure 2:
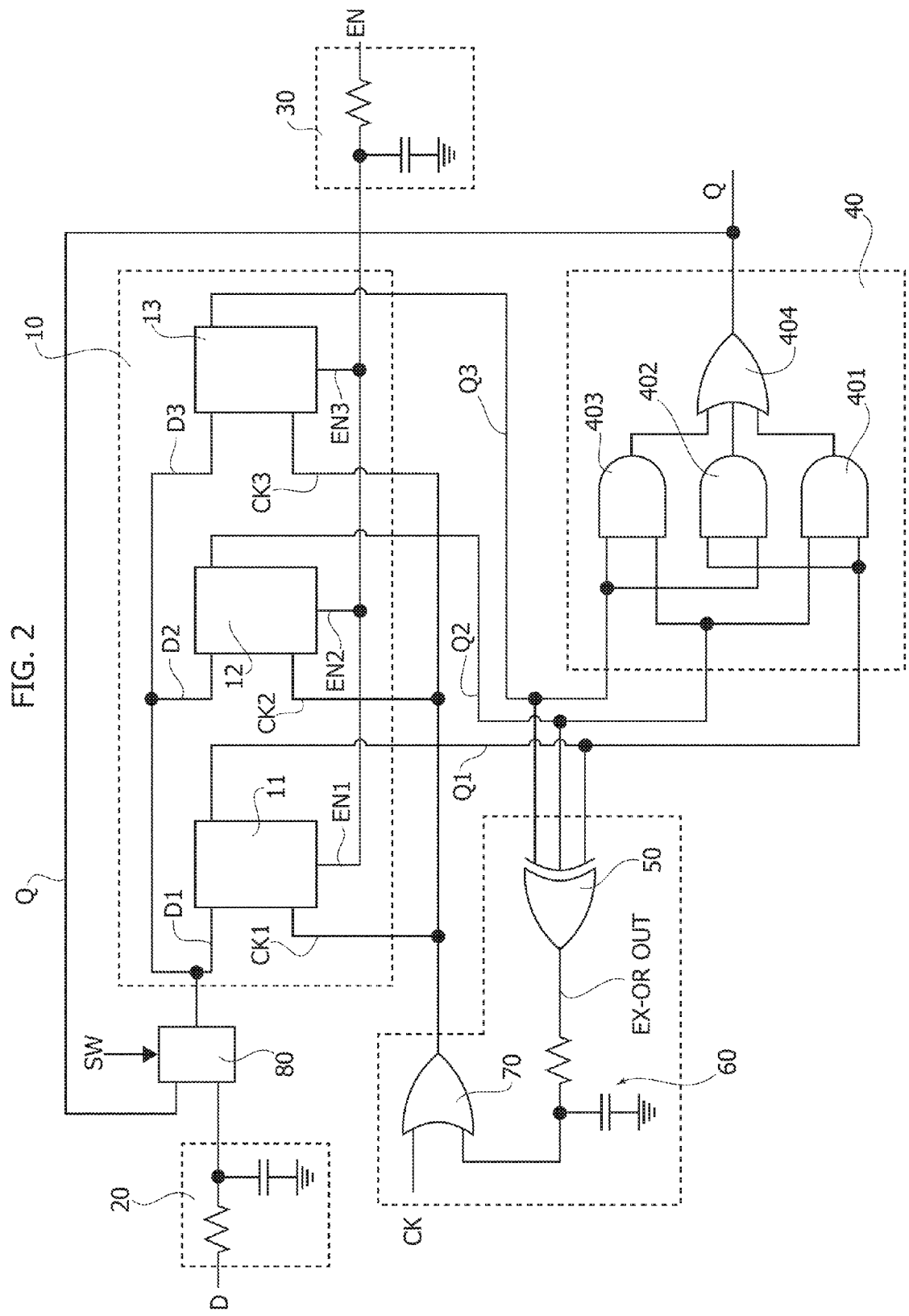
FIG. 2 is a detailed block diagram of one or more embodiments.

FIG. 2 is a block diagram exemplary of one or more embodiments resorting to a redundancy scheme with a stage 10 including a plurality of storage elements 11, 12 and 13 (for example an odd number such as three) each receiving input data D1, D2, D3 as well clock signals CK1, CK2, CK3 and enable signals EN1, EN2, EN3.

The input data D1, D2, D3 to the various elements (for example latches) 11, 12, 13 correspond to a "general" input data signal D which, in one or mere embodiments, may be subjected to low-pass filtering (for example via an RC filter 20). In one or more embodiments the input signal D may also traverse a pass gate (for example a multiplexer) 80 to be described in the following.

In one or more embodiments, low-pass filtering (for example in an RC filter 30) may be applied also to the enable signal EN, which is distributed to the enable inputs EN1, EN2 and EN3 of the latches 11, 12 and 13.

Reference 40 denotes as a whole a "voting" cell including for example three AND gates 401, 402, 403 and an OR gate 404 which receives the outputs from the AND gates 401, 402, 403 and produces a "general" output signal Q.

In or more embodiments, the cell 40 is intended to produce the output Q using as an input the outputs Q1, Q2 and Q3 from the latches 11, 12 and 13, so that Q has the same logic value as the majority of the logic signals Q1, Q2 and Q3.

For instance:
if two of Q1, Q2 and Q3 are "1" and one is "0", then Q is set to "1";
if two of Q1, Q2 and Q3 are "0" and one is "1", then Q is set to "0".

In or more embodiments the input arrangement for the AND gates 401, 402, 403 may be as follows:
input to the gate 401: the output signal Q1 from the latch 11 and the output signal Q2 from the latch 12;
input to the gate 402: output Q1 from the latch 11 and output Q3 from the latch 13;
input to the gate 403: output Q2 from the latch 12 and output Q3 from the latch 13.

Such an arrangement make it possible to produce a value for the output Q corresponding to the "majority" of the values of Q1, Q2, and Q3. For instance if Q1=Q2=1 and Q3=0, the output for Q is set equal to 1. Conversely, if Q1=1 and Q2=Q3=0 the output value for Q is set to 0.

Those of skill in the art will appreciate that equivalent arrangements for the "voting" cell 40 may be devised.

In one or more embodiments, the outputs Q1, Q2 and Q3 from the three latches 11, 12, 13 may also be input to an EX-OR (exclusive OR) gate 50 whose output is fed (possibly after low-pass filtering at for example a RC filter 60) to one of the inputs of an OR gate 70, the OR gate 70 receiving the clock signal CK as another input.

In one or more embodiments, the output signal Q may be fed back to the pass gate 80 so that either the low-pass filtered input signal D or the output signal Q may be input to the redundant arrangement including the latches 11, 12, 13 under the control of signal SW.

In one or more embodiments, the data D input to the circuit (for example from circuit 20) may be stored in the circuit upon receiving a clock signal CK.

Once a steady state is reached the data is fixed at the output Q and, after a number of clock pulses, the pass gate 80 (originally intended to feed the data D to the circuit) may switch to a condition where the signal Q is fed back towards the latches 11, 12, 13 so that the upstream circuitry may (at least notionally) be turned off.

In one or more embodiments, generation and count of the signal SW may take place externally, for example by means of a counter or microprocessor, with the signal SW input to the pass gate 80 as shown in FIG. 2.

In one or more embodiments, generation and count of the signal SW may take place internally of the pass gate 80 for example by means of counters implemented in the pass gate 80: for instance a counter may count, for example 16 clock pulses after which the pass gate 80 switches to the condition where the output Q is fed back to the latches 11, 12, 13.

One or more embodiments may thus create a clock pulse for driving the latches 11, 12 and 13 only when an event (such as a SEE like a Single Event Transient or SET) occurs which modifies the data in one of the redundant flip-flops 11, 12 and 13.

In one or more embodiments, the EX-OR gate 50 is adapted to detect such an occurrence.

The output data Q1, Q2 and Q3 of the flip-flops 11, 12, 13 are compared in the gate 50. As long as Q1, Q2 and Q3 are at the same logical value, the output from the gate 50 is at a low value.

If the logical state of any of Q1, Q2, Q3 is changed, for example by a SET, the output from the gate 50 switches, for example to a high logic level thus generating a refresh pulse which (after possible low-filtering 60) is applied to the latches 11, 12, 13 via the gate 70.

The following is a truth table exemplary of possible values for Q1, Q2, Q3, the value Q corresponding to result of "voting" in the cell 40 and the output from the EX-OR gate 50.

Those skilled in the art will promptly appreciate that other logical networks other than those exemplified herein may be used to implement the same truth table.

| Q1 | Q2 | Q3 | Q | EX-OR OUT (gate 50) |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 1 |
| 1 | 0 | 0 | 0 | 1 |
| 1 | 0 | 1 | 1 | 1 |
| 1 | 1 | 0 | 1 | 1 |
| 1 | 1 | 1 | 1 | 0 |

Figure 3:
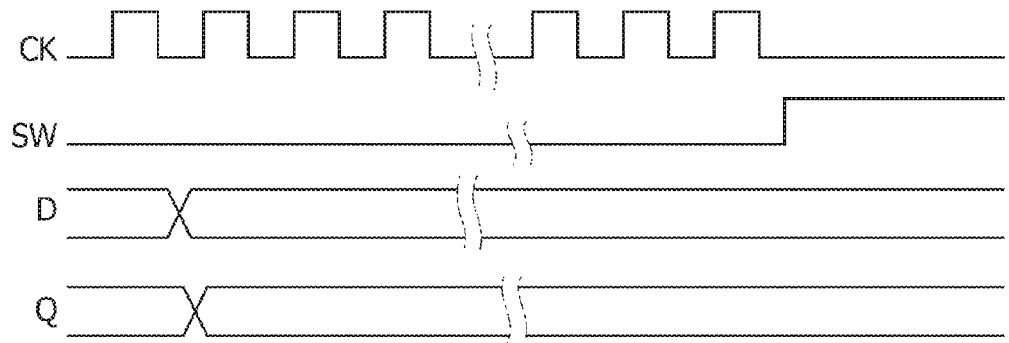
FIGS. 3 and 4 are chronograms exemplary of signals which may occur in a memory cell of one or more embodiments.

The chronogram of FIG. 3 shows a possible time behavior (related to a common time scale) of the clock signal CK, the switch signal SW, the input data signal D and the output data signal Q exemplary of "regular" operation of the memory cell.

For instance, upon cell turn on, the input data D may be applied via the multiplexer 80 to the inputs of the latches 11, 12, 13 after low-pass filtering at 20 with a time constant larger than TIon (the expected duration of disrupting event related e.g. to radiation impact of heavy ions). A train of clock pulses CK may then "fix" the input D in the three redundant memory cells (latches 11, 12 and 13) and the outcome of "voting" in the cell 40 may then be fixed as the general output Q.

As described previously, in one or more embodiments, an end count pulse SW may then cause the pass gate 80 to switch so that the output Q may be brought to the inputs of the latches 11, 12, 13, and the circuits located upstream of the memory cell (such circuits not being visible in the figures) may be disabled for example in order to avoid undesired propagation of noise and/or unnecessary power consumption.

In one or more embodiments, low-pass filtering (at 60) of the output from the EX-OR gate 50 may avoid that, during initial operation as described previously, any asymmetry in the responses of the latches 11, 12, and 13 may undesirably lead to a lock status for the clock CK.

Figure 4:
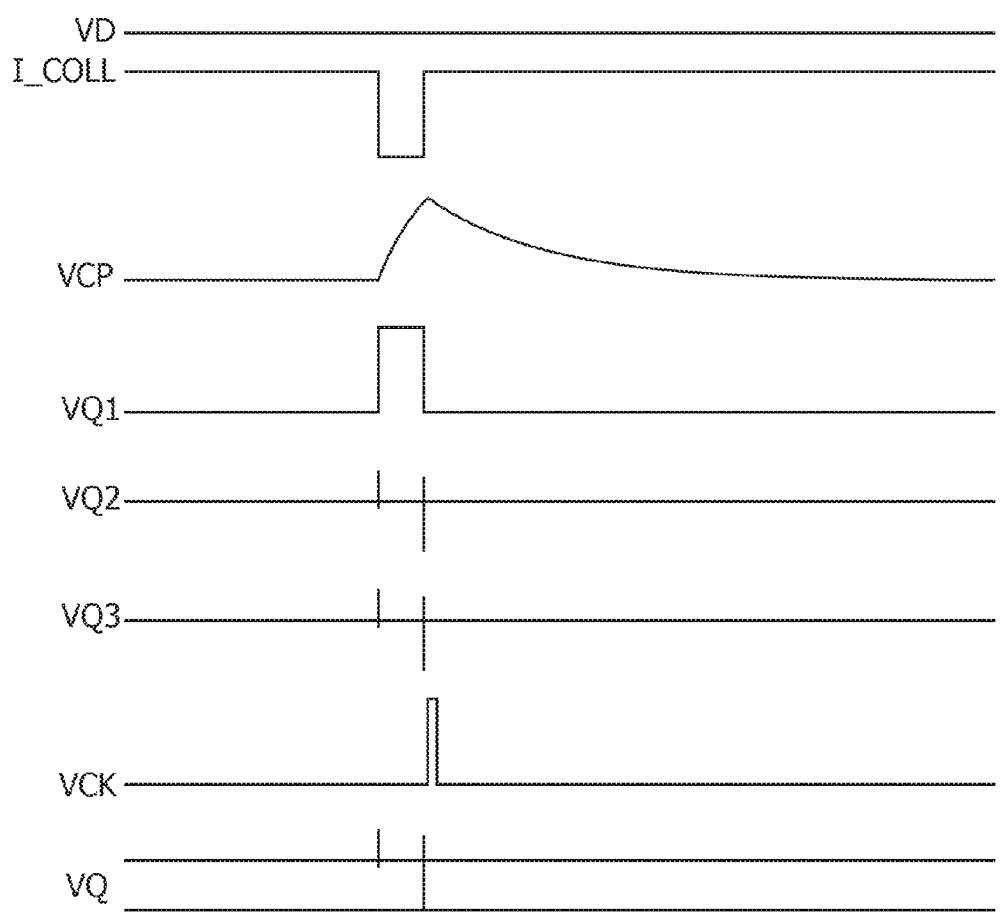

The diagrams of FIG. 4 are exemplary of the possible effect of for example a heavy ion hitting one of the three latches 11, 12, 13 thus giving a rise to a "collision" pulse I_COLL while the input data D should notionally remain at a constant value VD.

For instance, one may assume that the pulse I_COLL affects for example the first latch 11 by inducing a corresponding change in the voltage VQ1 associated with the output Q1. Such a change in the logic condition of latch will activate the EX-OR logic gate 50 by causing it to generate a corresponding clock pulse which, after low-pass filtering at 60 may exhibit the time behavior exemplified as VCP in FIG. 4. Such a pulse will propagate to the OR gate 70 and from here to the clock input CK1, CK2, CK3, so that a refresh pulse VCK from the gate 70 will cause the correct logical state VQ1 to be restored at the output Q1.

In that way the memory cell may be refreshed upon the occurrence of a SEE for example a SET, thus avoiding that plural events subsequently affecting different ones of the storage elements 11, 12, and 13 may lead to a reversal of the majority in the voting cell 40.

One or more embodiments may thus include a plurality of storage elements for example an odd number such a three of storage elements such as for example latches 11, 12, 13, which are intended to redundantly store input data logic signals D. The storage elements 11, 12, 13 may have output lines for outputting a respective plurality of logic signals Q1, Q2, Q3 having respective logic values. A logic combination network (401 to 404) sensitive to the respective logic values of these logic signals Q1, Q2, Q3 may be configured for generating an output signal Q of the cell having the same logic value as a majority of these logic signals Q1, Q2, Q3 on the output lines of the storage elements 11, 12, 13. An exclusive logic sum circuit (for example an EX-OR gate such as 50) may be sensitive to the respective logic values of the logic signals Q1, Q2, Q3 on the output lines of the storage elements 11, 12, 13 and be activatable to produce refresh of the logic data signals D1, D2, D3 as stored in the storage elements 11, 12, 13 when one of these logic signals Q1, Q2, Q3 undergoes a logic value transition due for example to a SEE such as a SET.

In one or more embodiments, the storage elements 11, 12, 13 may have common data inputs D1, D2, D3, common clock inputs CK1, CK2, CK3 and/or common enable inputs EN1, EN2, EN3.

In one or more embodiments, the common clock inputs CK1, CK2, CK3 may be driven by the exclusive logic sum circuit 50, optionally through a low-pass filter 60.

In one or more embodiments, the common clock inputs CK1, CK2, CK3 may be configured for being driven alternatively, optionally via a logic sum gate 70 by:
- an input clock signal CK, or
- the exclusive logic sum circuit 50.

One or more embodiments may include low-pass filtering of:
- a common data input D1, D2, D3 to the plurality of storage elements 11, 12, 13 and/or
- a common enable input EN1, EN2, EN3 to the plurality of storage elements 11, 12, 13.

Without prejudice to the underlying principles, the details and embodiments may vary, even significantly, with respect to what has been disclosed by way of example only without departing from the extent of protection.

The extent of protection is defined by the annexed claims.

The invention claimed is:

1. A memory cell, comprising:
    a plurality of storage elements for redundantly storing an input data logic signal, said plurality of storage elements having output lines for outputting a respective plurality of logic signals having respective logic values,
    a logic combination network sensitive to said respective logic values of said logic signals on said output lines, said logic combination network configured to generate an output signal of the cell having the same logic value as a majority of said logic signals on said output lines, and an exclusive logic sum circuit sensitive to said respective logic values of said logic signals on said output lines, said exclusive logic sum circuit configured to produce a refresh of said data logic signal as stored in said plurality of storage elements, said exclusive logic sum circuit activated when one of said logic signals on said output lines undergoes a logic value transition.

2. The memory cell of claim 1, wherein said plurality of storage elements includes an odd number of storage elements.

3. The memory cell of claim 1, wherein said plurality of storage elements comprise latch elements.

4. The memory cell of claim 1, wherein said storage elements include at least one of:
common data inputs;
common clock inputs;
common enable inputs.

5. The memory cell of claim 4, wherein said common clock inputs are driven by said exclusive logic sum circuit.

6. The memory cell of claim 5, further including a low-pass filter coupled between an output of the exclusive logic sum circuit and the common clock inputs.

7. The memory cell of claim 4, wherein said common clock inputs are configured for being driven alternatively by a logic sum gate by:
an input clock signal, or
a refresh signal output from the exclusive logic sum circuit.

8. The memory cell of claim 1, wherein said exclusive logic sum circuit includes an EX-OR gate sensitive to said logic signals on said output lines of said storage elements.

9. The memory cell of claim 1, further including a low-pass filter coupled at one location of:
a common data input to said plurality of storage elements,
a common enable input to said plurality of storage elements.

10. An electronic device including a memory cell, comprising:
a plurality of storage elements for redundantly storing an input data logic signal, said plurality of storage elements having output lines for outputting a respective plurality of logic signals having respective logic values,
a logic combination network sensitive to said respective logic values of said logic signals on said output lines, said logic combination network configured to generate an output signal of the cell having the same logic value as a majority of said logic signals on said output lines, and an exclusive logic sum circuit sensitive to said respective logic values of said logic signals on said output lines, said exclusive logic sum circuit configured to produce a refresh of said data logic signal as stored in said plurality of storage elements, said exclusive logic sum circuit activated when one of said logic signals on said output lines undergoes a logic value transition.

11. The device of claim 10, wherein said device is one of:
a read only memory,
a digital counter,
a shift register,
an analog-to-digital converter.

12. A memory cell, comprising:
a plurality of storage elements for redundantly storing an input data logic signal, said plurality of storage elements having output lines for outputting a respective plurality of logic signals having respective logic values, and
a sensing circuit monitoring the plurality of logic signals to detect a single event transient (SET) error and in response thereto cause a refresh of said data logic signal as stored in said plurality of storage elements.

13. The memory cell of claim 12, further comprising a logic combination network receiving said logic signals on said output lines and configured to generate an output signal having a logic value that is the same as the logic value of a majority of said logic signals on said output lines.

14. The memory cell of claim 12, wherein said sensing circuit comprises an exclusive logic sum circuit receiving said logic signals on said output lines as inputs and having an output configured to generate a refresh signal when one of said logic signals on said output lines undergoes a logic value transition.

15. The memory cell of claim 14, further comprising a low pass filter circuit coupled between the output of the exclusive logic sum circuit and the plurality of storage elements.

16. The memory cell of claim 12, wherein said plurality of storage elements share a common clock signal input, and wherein said sensing circuit generates a refresh signal applied to said common clock signal input.

17. The memory cell of claim 16, further comprising a logic OR gate having a first input receiving a clock signal and a second input receiving said refresh signal and having an output coupled to said common clock signal input.

* * * * *